United States Patent [19]

Nishimatsu et al.

[11] 4,433,228
[45] Feb. 21, 1984

[54] MICROWAVE PLASMA SOURCE

[75] Inventors: Shigeru Nishimatsu, Kokubunji; Keizo Suzuki, Hachioji; Noriyuki Sakudo, Ome; Ken Ninomiya, Tokyo; Hidemi Koike, Tokorozawa; Osami Okada, Chofu; Shinjiro Katagiri, Katsuta; Sadayuki Okudaira, Kokubunji, all of Japan

[73] Assignee: Hitachi, Ltd., Tokyo, Japan

[21] Appl. No.: 319,987

[22] Filed: Nov. 10, 1981

[30] Foreign Application Priority Data

Nov. 12, 1980 [JP] Japan ................. 55-158300

[51] Int. Cl.³ .............................. H05G 9/06
[52] U.S. Cl. .................. 219/10.55 R; 219/121 PG; 219/121 PD; 219/10.55 A
[58] Field of Search ............. 219/10.55 R, 10.55 A, 219/121 PY, 121 PG, 121 PD; 156/643, 646; 204/155, 156, 157.1 R, 164

[56] References Cited

U.S. PATENT DOCUMENTS

| 3,467,885 | 9/1969 | Cann | 219/121 PY |
| 4,049,940 | 9/1977 | Moisan et al. | 219/10.55 R |
| 4,286,135 | 8/1981 | Green et al. | 219/10.55 R |
| 4,339,326 | 7/1982 | Hirose et al. | 204/298 |

FOREIGN PATENT DOCUMENTS 2837594  3/1979  Fed. Rep. of Germany ...... 219/121 PY

*Primary Examiner*—Roy N. Envall, Jr.
*Assistant Examiner*—M. M. Lateef
*Attorney, Agent, or Firm*—Antonelli, Terry & Wands

[57] ABSTRACT

The microwave plasma source of this invention comprises a vacuum room which forms a discharging space with discharge gas introduced therein, a means for conducting the microwave to the discharging space so that the microwave electric field is provided in the discharging space, and a means for providing the magnetic field in the discharging space located on the microwave propagating path and made up of a permanent magnet which virtually propagates the microwave.

20 Claims, 15 Drawing Figures

MICROWAVE PLASMA SOURCE

BACKGROUND OF THE INVENTION

The present invention relates to the improvement of a microwave plasma source, and more particularly to power saving features in such microwave plasma sources.

Due to an increasing degree of integration in semiconductor integrated circuits, manufacturing apparatus such as etching apparatus, ion implantation apparatus and deposition apparatus are required to have further enhanced performance. In order to meet such a requirement, a microwave plasma etching apparatus has been proposed in, for example, Japanese Patent Publication No. 53-34463, which is owned by the same assignee as the present application. FIG. 1 shows the basic structure of the microwave plasma etching apparatus as proposed. The operation of the apparatus will be briefed in the following. The microwave energy at a frequency of 2.45 GHz generated by a microwave generator such as a magnetron is propagated through a round waveguide 2 formed of copper, for example, to a vacuum room 5 which consists of a discharge tube 3 and a vacuum chamber 4 made of alumina or quartz. The vacuum room 5 is maintained in a vacuum state by an evacuation system 6. The vacuum chamber 4 is provided with a substrate stage 7, on which a sample 8 such as a semiconductor wafer to be etched is placed. Around the waveguide 2 enclosing the discharge tube 3, there is disposed an electromagnet (solenoid) 9, and behind the substrate stage 7, there is disposed a permanent magnet 10. In such an arrangement, a spatial region enclosed by the vacuum chamber 5 and the discharge tube 3 within the vacuum room 5 forms a discharging space 11, in which an electric field caused by the microwave and a magnetic field caused by the electromagnet 9 and the permanent magnet 10 are provided. In this state, when a discharge gas such as $CF_4$ in a partial pressure of around $1 \times 10^{-3}$ Torr is conducted into the discharging space 11, it is reduced to the plasma state by the multiplier effect on the electric and magnetic fields. An ion sheath is formed between the generated plasma and the sample 8, and the sample 8 is hit by ions in the plasma. Consequently, the surface of the sample 8 is etched by ions.

A microwave plasma ion implantation apparatus has been proposed in Japanese Patent Application No. 54-68952 filed by the same assignee of the present application. FIG. 2 shows the basic structure of the microwave plasma ion implantation apparatus. The operation of the apparatus will be briefed hereunder. The microwave energy at a frequency of 2.45 GHz propagates through a rectangular wave guide 2', a choke flange 12, a ridged wave guide 13 formed of copper, and a vacuum sealing insulator plate 14 made of alumina to a discharging space 11 within a discharge tube 3. A microwave electric field is produced in the discharging space between ridged electrodes 15. Around the ridged electrodes 15, there is provided an electromagnet 9 which produces the magnetic field in the discharging space 11. A vacuum room 5 consisting of the discharge tube 3 and a vacuum chamber 4 is maintained in a vacuum state by an evacuation system 6. When a discharge gas such as $PH_3$ in a partial pressure of around $8 \times 10^{-6}$ Torr is introduced into the vacuum chamber 5, it is reduced to plasma state by the multiplier effect on the electric and magnetic fields in the discharging space 11. Ions in the produced plasma are extracted by extraction electrodes 16 disposed within the vacuum chamber 4. Extracted ions are introduced through a mass separator 17 to a process chamber 18. Then, the ions are projected onto the sample 8 such as a semiconductor wafer through a slit system 19. Consequently, an implanted layer is formed on the surface of the sample 8.

The above mentioned etching apparatus and the ion implantation apparatus commonly have a plasma generating means. Both types of apparatus reduce discharge gas in the discharging space 11 into plasma state, then extract ions extracted from plasma are used to make fine patterns on the surface of the sample substrate 8. Both types of apparatus utilize the multiplier effect on the microwave electric and magnetic fields for reducing the discharge gas to the plasma state. The magnetic field needs to be produced in the axial direction of the wave guides 2 and 13 in an intensity of around 1000 gauss. The magnetic field is produced by the electromagnet 9 as mentioned above, and it generally requires a few kW of power (e.g. 60 V, 20 A) to obtain the magnetic field at this level. The foregoing etching apparatus has the discharging space 11 of a large diameter D, and it is necessary to produce a high density plasma uniformly in the radial direction. Therefore, the majority of the power for the etching apparatus is likely to be consumed by the electromagnet 9. Furthermore, it can generally not be avoided that a number of the samples 9 must be subject to the fine process simultaneously for increasing productivity. In order to meet this requirement, it is necessary to develop a microwave plasma etching apparatus or a microwave plasma ion implantation apparatus each having the discharging space 11 with a large diameter D. However, as the diameter D of the discharging space 11 increases, the diameter of the electromagnet 9 also increases proportionally. Since creation of plasma needs the magnetic field at a certain level, it is obvious that a larger diameter D of the discharging space will result in a very large power consumption in the electromagnet 9. The increased power consumption does not meet the contemporary requirement for energy saving, and it has been desired in the industry to resolve this problem.

SUMMARY OF THE INVENTION

Accordingly, it is an object of the present invention to provide a microwave plasma source with considerably less power consumption.

In order to achieve the above-mentioned object, the microwave plasma source according to the present invention comprises a vacuum room forming a discharging space and having an introduced discharge gas therein, a means for introducing microwave energy to the discharging space for providing a microwave electric field therein, and a means for providing a magnetic field in the discharging space constituted by a permanent magnet which is disposed in the microwave propagating path and which is adapted to virtually transmit the microwave.

According to these structural features of the present invention, there is attained a considerable reduction in power consumption for producing the magnetic field in the discharging space. Moreover, an increased diameter of the discharging space only requires an increase in the diameter of the permanent magnet, eliminating any anxiety about the increase of power consumption.

DESCRIPTION OF THE PREFERRED EMBODIMENTS

Figure 1:
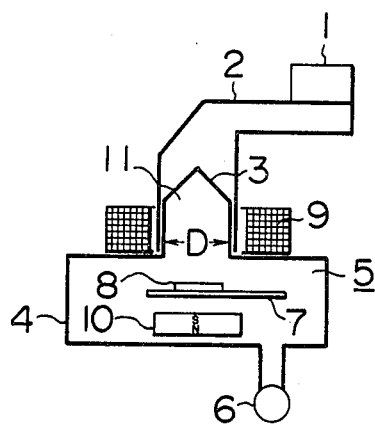
FIG. 1 is a basic structural view of the conventional microwave plasma etching apparatus.
Figure 3:
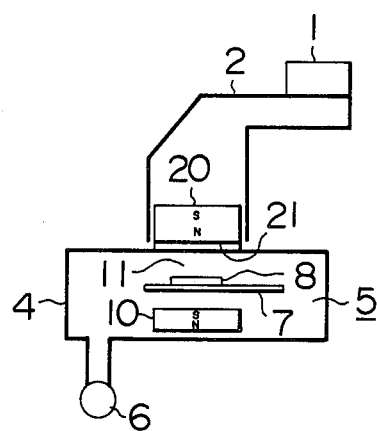
FIG. 3 is a basic structural view of an etching apparatus with a microwave plasma source of this invention applied thereto.

Embodiment 1:

FIG. 3 shows a basic structure of an etching apparatus using a microwave plasma source according to the present invention. The etching apparatus of this invention as shown in FIG. 3 differs from the conventional etching apparatus of FIG. 1 in two points. Firstly, the discharge tube 3 is eliminated and substituted by a vacuum sealing plate 21 made of quartz or alumina ceramic and disposed between the waveguide 2 and the vacuum chamber 4. Secondly, a cylindrical permanent magnet plate 20 which is the most important characteristic of this invention, is provided on the vacuum sealing plate 21, eliminating the magnet 9. The permanent magnet plate 20 is disposed within a round copper wave guide 2 which propagates the microwave energy at a frequency of 2.45 GHz generated by the microwave generator 1 such as the magnetron. Confronting the permanent magnet plate 20, there is disposed another permanent magnet plate 10 so as to define a discharging space 11 formed within the vacuum room 5. The sample 8 such as the semiconductor wafer is placed on the substrate stage 7 made of insulator and positioned between the permanent magnets 9 and 20. The permanent magnet 20 is preferably an insulating or near-insulating permanent magnet having high resistivity, so that it transmits the microwave without practically causing a loss. The most suitable permanent magnet for this purpose is a ferrite magnet such as a ferrite magnet having Ba or Sr as a component. The microwave mostly passes through the permanent magnet plate 20 while rotating its oscillating electric fields (polarization plane). Here, a consideration will be made on the propagation of the microwave in the round wave guide 2 with the permanent magnet plate 20 placed therein. In the permanent magnet plate 20, a magnetic field appears in the axial direction of the wave guide 2. While the microwave passes through the permanent magnet plate 20 by the unit length, the oscillating plane (polarization plane) of the microwave rotates clockwise by an angle of $\theta$ around the center axis of the wave guide 2. The angle $\theta$ varies depending on the intensity of the magnetic field. Assuming that the microwave is propagated in mode TE11 which is the lowest-degree mode of the round wave guide 2, the microwave keeps the TE11 mode even if the polarization plane rotates, causing no variation in the propagation characteristics. On the other hand, however, when the microwave is propagated in a rectangular wave guide 2, the rotation of the polarization plane in the lowest-degree mode of TE10 causes the characteristic impedance of the wave guide to vary, resulting in a variation of the propagation characteristics. In addition, when the angle $\theta$ is exactly 90°, the propagation mode becomes TE01. The rectangular wave guide is generally designed so that it does not operate in mode TE01. Accordingly, it is most desirable to use a round wave guide when a permanent magnet plate is placed within the wave guide. As a principle, however, if the propagation efficiency is not taken into account, either a rectangular or elliptic wave guide can be used to far as it does not cut off the propagation even if the polarization plane rotates.

The microwave propagated through the permanent magnet 20 then passes through the vacuum sealing plate 21 and creates a microwave electric field in the discharging space 11. On the other hand, a magnetic field is produced in the discharging space 11 by the permanent magnet plates 20 and 10. The permanent magnet 10 may be a common permanent magnet without restriction on the material as in the case of the permanent magnet 20. When a discharge gas such as $CF_4$ in a partial pressure of around $1 \times 10^{-3}$ Torr is introduced into the vacuum room 5, the $CF_4$ gas is reduced to the plasma state in the discharging space 11 due to the multiplier effect on the electric and magnetic fields. An ion sheath is formed between the created plasma and the sample 8, and ions in plasma hit the surface of the sample 8. Consequently, the surface of the sample 8 is etched by these ions.

In order to produce the magnetic field of about 1000 gauss in the discharging space 11, the permanent magnet plates 20 and 10 are formed of a Ba-series ferrite magnet in the following way. Two pieces of the Ba-series ferrite magnet plates having a diameter of 180 mm and a thickness of 60 mm are disposed in parallel with a distance of 100 mm placed therebetween, so that the magnetic field with a central intensity of about 1000 gauss, which is enough to create the plasma state, is obtained.

In case the permanent magnet plate 20 is heated by absorption of part of the microwave, it will be necessary to cool the magnet plate using water or air.

Figure 4:
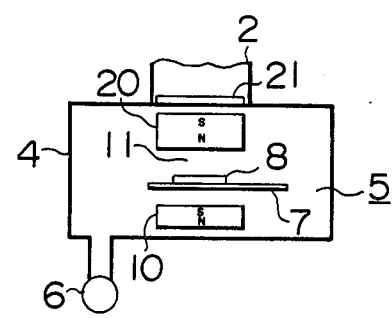
FIGS. 4 through 8 and FIGS. 10 through 15 are basic structural views of different etching apparatus with microwave plasma sources of this invention applied thereto.

Embodiment 2:

FIG. 4 shows another embodiment of the etching apparatus using the microwave plasma source according to the present invention. This embodiment differs from the first embodiment shown in FIG. 3 by virtue of the location of the permanent magnet plate 20. In the first embodiment, the permanent magnet plate 20 is disposed within the wave guide 2 but outside of the vacuum room 5, whereas in the embodiment 2, the permanent magnet plate 20 is disposed within the vacuum room 5 so that the discharging space 11 is formed between the permanent magnet plate 20 and the sample 8. This arrangement also allows the discharging space 11 to provide plasma as in the case of the foregoing embodiment 1, and the sample 8 is etched by ions in plasma.

Figure 5:
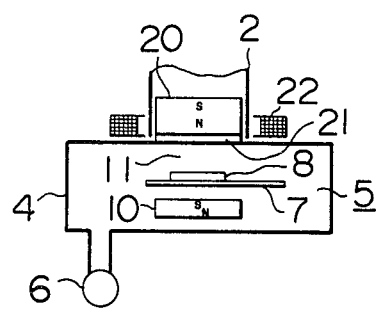

Embodiment 3:

FIG. 5 shows still another embodiment of the etching apparatus using the microwave plasma source according to the present invention. This embodiment differs from the first embodiment shown in FIG. 3 by virtue of the presence of an electromagnet 22 provided around the wave guide 2. In this case, the permanent magnet plates 20 and 10 produce a constant magnetic field in the discharging space 11. Although a constant magnetic field is required in the discharging space 11, an auxiliary electromagnet 22 is provided to facilitate the fine adjustment for the intensity of the magnetic field. The power consumption of the electromagnet 22 is small, since it only has to provide a weak magnetic field which is sufficient to modify the field intensity in the discharging space 11.

Figure 6:
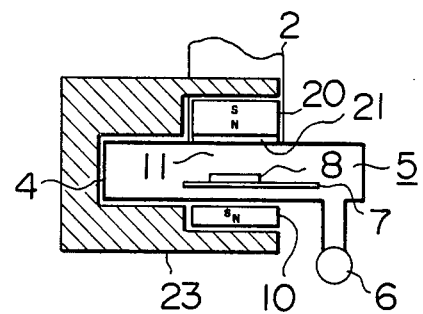

Embodiment 4:

FIG. 6 shows still another embodiment of the etching apparatus using the microwave plasma source according to the present invention. This embodiment differs from the first embodiment shown in FIG. 3 on two points. First, the permanent magnet plate 10 is located outside of the vacuum room 5, and, second, a magnetic circuit 23 formed of materials having high magnetic permeabilities, e.g. soft iron, is provided between the permanent magnet plates 20 and 10. By installing the permanent magnet plate 10 outside of the vacuum room 5, it is free from the influence of plasma formed in the discharging space 11. Moreover, the permanent magnet plate 10 located outside of the vacuum room 5 facilitates the formation of the magnetic circuit 23, which allows the concentration of the magnetic field in the discharging space 11.

Figure 7:
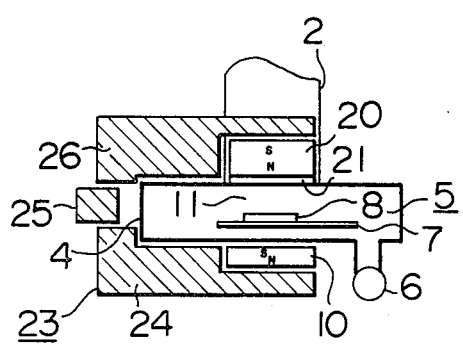

Embodiment 5:

FIG. 7 shows still another embodiment of the etching apparatus using the microwave plasma source according to the present invention. This embodiment differs from the fourth embodiment shown in FIG. 6 by the provision of the magnetic circuit 23. In FIG. 7, the magnetic circuit 23 is divided into magnetic circuit parts 24, 25 and 26, and the magnetic circuit part 25 is displaced from other magnetic circuit parts 24 and 26 so that the magnetic resistance of the magnetic circuit 23 is varied. Thus, the intensity of the magnetic field produced in the discharging space can be adjusted precisely.

Figure 8:
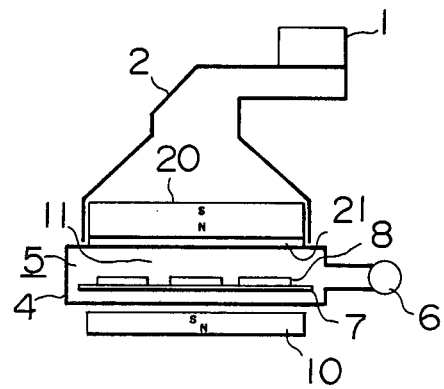

Embodiment 6:

FIG. 8 shows still another embodiment of the etching apparatus using the microwave plasma source according to the present invention. This embodiment chiefly differs from the first embodiment shown in FIG. 3 in the use of the flared discharging space 11. In FIG. 8, the round wave guide 2 flares at the side of the vacuum room 5, and the permanent magnet plates 20 and 10 have a large diameter comparable with the end of the wave guide. In this arrangement, a wide discharging space 11 is formed, allowing an increased number of samples 8 to be etched simultaneously and thereby improving the productivity. In the arrangement of the expanded discharging space 11, a magnetic field which is strong enough to provide plasma can be produced merely by increasing the diameter of the permanent magnet plates 20 and 10. Accordingly, an increase in the power consumption relative to the case of the conventional electromagnet structure need not be considered at all.

Figure 2:
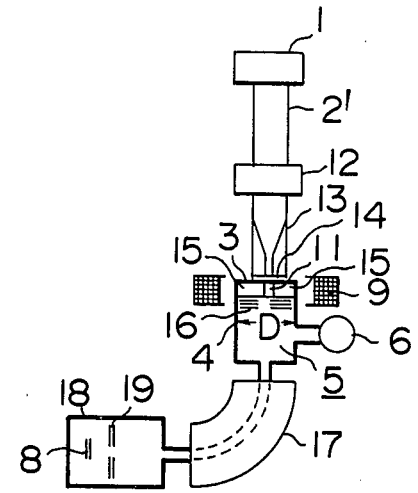
FIG. 2 is a basic structural view of the conventional microwave plasma ion implantation apparatus.
Figure 9:
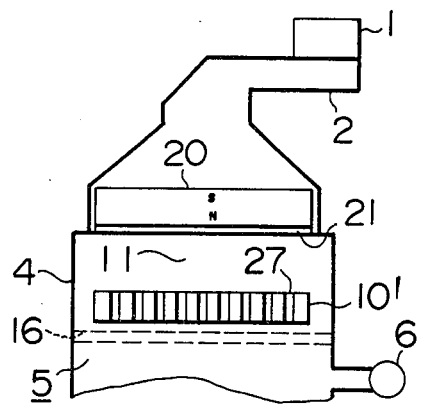
FIG. 9 is a basic structural view of an ion implantation apparatus with a microwave plasma source of this invention applied thereto.

Embodiment 7:

FIG. 9 shows the basic structure of the ion implantation apparatus using the microwave plasma source according to the present invention. The major difference of this embodiment from the conventional ion implantation apparatus shown in FIG. 2 resides in the expanded discharging space 11. In FIG. 9, the microwave generated by the microwave generator 1 is propagated in the round wave guide 2 and conducted into the vacuum room 5 through the permanent magnet plate 20 and vacuum sealing plate 21. The vacuum room 5 is provided with a permanent magnet plate 10' having a plurality of through holes 27 confronting the permanent magnet plate 20. In this arrangement, the discharging space 11 is formed between the permanent magnet plates 20 and 10' in the vacuum room 5. Ions in plasma of discharge gas created inside the discharging space 11 are extracted by a mesh extraction electrode 16 provided on the back side of the permanent magnet plate 10'. Extracted ions directly hit numerous samples (not shown in the figure) simultaneously, and an ion implantation layer is formed on the surface of the samples. It is also possible to conduct ions extracted by the extraction electrode through the mass separator 17 shown in FIG. 2 in order to expose the samples to ions of a selected type.

Figure 10:
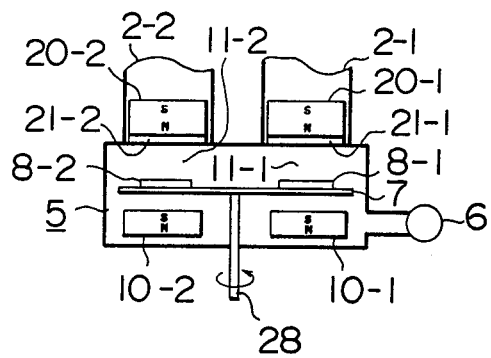

Embodiment 8:

FIG. 10 shows still another embodiment of the etching apparatus using the microwave plasma source according to the present invention. This embodiment includes a pair of basic arrangement shown in FIG. 3 as the first embodiment. In FIG. 10, the substrate stage 7 is rotated on a shaft 28 to turn samples 8-1 and 8-2, so that the samples 8-1 and 8-2 are exposed alternately to ions in plasma produced in a discharging space 11-1 by a wave guide 2-1 and permanent magnet plates 20-1 and 10-1, and to ions in plasma created in a discharging space 11-1 by a wave guide 2-2 and permanent magnet plates 20-2 and 10-2. Thus, the total etching (throughput of etching process) can be improved.

Figure 11:
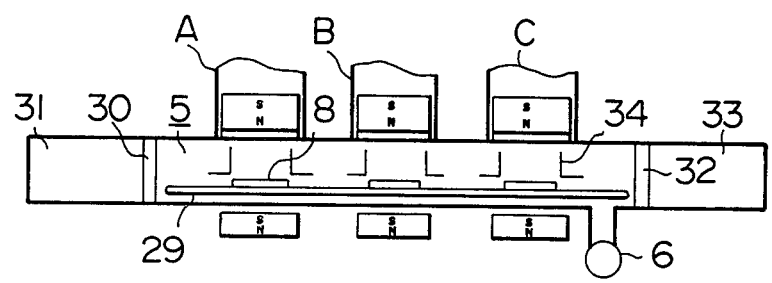

Embodiment 9:

FIG. 11 shows still another embodiment of the etching apparatus using the microwave plasma source according to the present invention. This embodiment features the use of three units of the basic structure shown in FIG. 3 connected to construct an etching apparatus. In FIG. 11, a moving belt 29 is provided within the vacuum room 5, and a sample 8 in a vacuum preparation chamber 31 is passed onto the moving belt 29 via a gate valve 30. The sample 8 introduced into the vacuum room 5 moves through etching units A, B and C sequentially, and finally goes out through a gate valve 32 to a vacuum preparation chamber 33 to complete the etching process. Reference number 34 denotes a mask. This arrangement allows the continuous operation for etching the sample 8.

Figure 12:
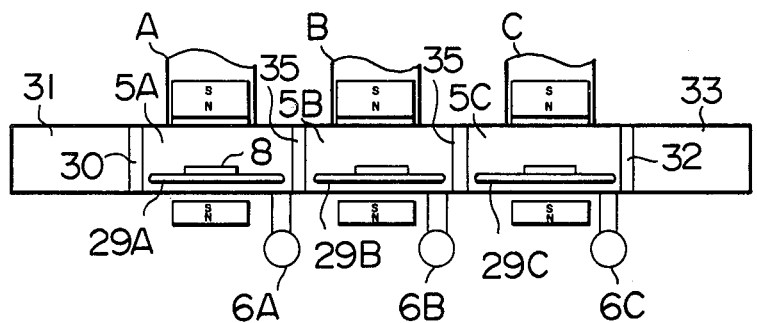

Embodiment 10:

FIG. 12 shows still another embodiment of the etching apparatus using the microwave plasma source according to the present invention. This embodiment differs from the ninth embodiment shown in FIG. 11 in the use of gate valves 35 provided between each etching unit. Vacuum rooms 5A, 5B and 5C are maintained in a vacuum state by evacuation systems 6A, 6B and 6C. A sample 8 in the vacuum preparation chamber 31 is passed onto a moving belt 29A through the gate valve 30. The sample 8 which has been etched in the etching unit A is then passed onto a moving belt 29B through the gate valve 35. The sample 8 which has been etched in the etching unit B is then passed onto a moving belt 29C through the gate valve 35. The sample 8 which has been etched in the etching unit C goes out through the gate valve 32 to the vacuum preparation chamber 33 to complete the etching process. This arrangement allows etching in different discharge gas and in different pressure.

The foregoing embodiments illustrate the microwave plasma source according to the present invention applied to the etching apparatus and ion implanting apparatus. The microwave plasma source according to the present invention can further be applied to the plasma deposition apparatus and plasma polymerization apparatus. In the foregoing embodiments, the permanent magnet plates 20 and 10 are each formed of a single permanent magnet. However, they may be formed of multi-layer magnets.

In the foregoing embodiments, the permanent magnet plates 20 and 10 are employed as a means for producing the magnetic field in the discharging space 11. This arrangement is most desirable practically although it is possible to provide plasma by using only the permanent magnet plate 20 in principle.

The characteristic impedance of the discharging space 11 varies depending on the shape of the magnetic field within the discharging space 11, and thus it is necessary to match the characteristic impedances of the wave guide 2 for introducing the microwave and of the discharging space 11. For this purpose, the shape of the magnetic field in the discharging space 11 needs to be modified appropriately. In addition, to provide plasma of discharge gas, a magnetic field of about 1000 gauss must be produced in the discharging space 11, as described previously, and the intensity of the field must be constant over a certain length (few centimeters) along the microwave propagating direction. The magnetic field intensity H produced by a permanent magnet disk having a magnetic induction of M, a radius of a and a thickness of t, at point P with a distance of x away from the surface of the disk on the central line is expressed in the following equation:

$$H = \frac{M}{2\mu_0}\left(\frac{(x+t)^2}{\sqrt{(x+t)^2+a^2}} - \frac{x^2}{\sqrt{x^2+a^2}}\right)$$

Figure 13:
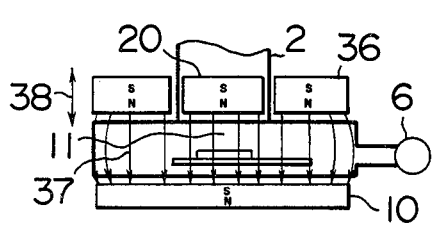
Figure 14:
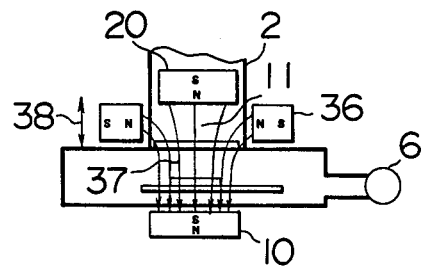
Figure 15:
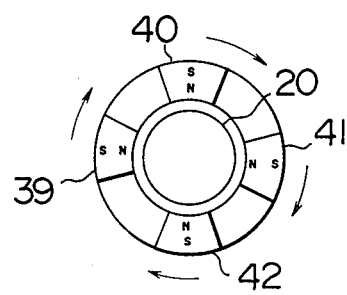

In order to maintain the magnetic field intensity H substantially constant against an increase in the distance x, the permanent magnet disk must have a large thickness t and radius a. For this purpose, the permanent magnet plates 20 and 10 may be added by a doughnut shaped permanent magnet plate 36 around the wave guide 2 as shown in FIG. 13 so as to maintain the magnetic field intensity of at least 1000 gauss in the discharging space 11. In the arrangement of FIG. 13, the permanent magnet plate 20 and the doughnut shaped permanent magnet plate 36 have the same magnitizing direction, so that the outward expansion of magnetic field lines 37 created by the permanent magnet plate 20 is suppressed by magnetic field lines of the doughnut shaped permanent magnet plate 36. Consequently, the magnetic field intensity on the center line of the permanent magnet plate 20 can be maintained constant over a considerable length. The shape of the magnetic field in the discharging space 11 can be varied by moving the doughnut shaped permanent magnet plate 36 in the direction shown by the arrow 38. FIG. 14 shows another embodiment where the permanent magnet plate 20 and the doughnut shaped permanent magnet plate 36 have the different magnetizing directions. The permanent magnet plate 36 is magnetized in the radial direction. This arrangement allows the concentration of the magnetic field lines 37 created by the permanent magnet plate 20, and a strong magnetic field can be produced in the discharging space 11. Also in this case, the shape of the magnetic field in the discharging space 11 can be varied by moving the permanent magnet plate 36 in the direction shown by the arrow 38. In case it is difficult to magnetize the doughnut shaped magnet plate 36 in this way, the magnet plate may be constructed by use of a plurality of permanent magnet pieces 39, 40, 41 and 42 as shown in FIG. 15. In such an arrangement, it is desirable to rotate the permanent magnet pieces 39-42 as shown by the arrows so as to average the unevenness of plasma generated in the discharging space, on a time basis.

As described above, the microwave plasma source according to the present invention produces the magnetic field for providing plasma not by the electromagnet, but by the permanent magnet, thereby considerably reducing the power consumption in the plasma source. Moreover, there is no significant rise in power consumption even in the arrangement of a microwave plasma source having a large diameter. Etching apparatus, ion implantation apparatus and deposition apparatus using the microwave plasma source according to the present invention are operated economically for making fine patterns on semiconductor materials and the like owing to their very small power consumption.

We claim:

1. A microwave plasma source comprising:
   a vacuum room which includes a discharging space in which discharge gas is introduced;
   means for introducing microwave energy through a propagating path leading to said discharging space to provide a microwave electric field in said discharging space; and
   a permanent magnet located in said propagating path leading to said discharging space for generating a magnetic field in said discharging space.

2. A microwave plasma source comprising:
   a vacuum room which includes a discharging space in which discharge gas is introduced;
   means for introducing microwave energy through a propagating path leading to said discharging space to provide a microwave electric field in said discharging space; and
   first and second magnetic field providing means confronting each other with said discharging space located therebetween to provide a magnetic field in said discharging space, said first magnetic field providing means being located in said propagating path leading to said discharging space and being formed of a permanent magnet.

3. A microwave plasma source according to claim 1 or 2, wherein said permanent magnet comprises a material having a high transmissivity for said microwave energy.

4. A microwave plasma source according to claim 3, wherein said permanent magnet is comprised of an insulating material.

5. A microwave plasma source according to claim 4, wherein said permanent magnet is a ferrite magnet including Ba.

6. A microwave plasma source according to claim 4, wherein said permanent magnet is a ferrite magnet including Sr.

7. A microwave plasma source according to claim 2, wherein said second magnetic field providing means is comprised of a permanent magnet.

8. A microwave plasma source according to claim 2 or 7, wherein said first and second magnetic field providing means are located in said vacuum room.

9. A microwave plasma source according to claim 1 or 2, further comprising an electromagnet located adjacent to said propagating path.

10. A microwave plasma source according to claim 3, further comprising an electromagnet located adjacent to said propagating path.

11. A microwave plasma source according to claim 3, wherein said propagating means comprises a circular waveguide.

12. A microwave plasma source according to claim 4, wherein said first magnetic field providing means is located outside of said vacuum room.

13. A microwave plasma source according to claim 4, wherein said second magnetic field providing means is located outside of said vacuum room.

14. A microwave plasma source according to claim 4, wherein said first and second magnetic field providing means are both located outside of said vacuum room.

15. A microwave plasma source according to claim 14, wherein said first and second magnetic field providing means are coupled by a magnetic circuit.

16. A microwave plasma source according to claim 15, wherein said magnetic circuit has the magnetic resistance thereof being variable.

17. A microwave plasma source according to claim 12, 13, 14, 15 or 16, wherein said second magnetic field providing means is comprised of a permanent magnet.

18. A microwave plasma source according to claim 4 wherein said second magnetic field providing means is located within said vacuum room and is comprised of a permanent magnet having a plurality of through holes provided in the thickness direction.

19. A microwave plasma source comprising:
a vacuum room which includes a discharging space in which discharge gas is introduced;
means for introducing microwave energy through a propagating waveguide leading to said discharging space to provide a microwave electric field in said discharging space; and
first and second permanent magnets confronting each other with said discharging space located therebetween to provide a magnetic field in said discharging space, said first magnetic field providing means being located in said propagating waveguide leading to said discharging space and being formed of a material which has a high transmissivity for said microwave energy.

20. A microwave plasma source according to claim 19, wherein said propagating waveguide is a circular waveguide.

* * * * *